Kuny et al.

United States Patent [19]

[11] 4,158,823
[45] Jun. 19, 1979

[54] TRANSDUCER ELECTRODES FOR FILTER OR DELAY LINES UTILIZING SURFACE WAVES

[75] Inventors: Wilhelm Kuny, Gruenwald; Karl Langecker, Munich, both of Fed. Rep. of Germany

[73] Assignee: Siemens Aktiengesellschaft, Berlin and Munich, Fed. Rep. of Germany

[21] Appl. No.: 783,836

[22] Filed: Apr. 1, 1977

[30] Foreign Application Priority Data

Apr. 26, 1976 [DE] Fed. Rep. of Germany ....... 2618144

[51] Int. Cl.² .............. H03H 9/04; H03H 9/26; H03H 9/30; H01L 41/10
[52] U.S. Cl. .................................. 333/151; 333/194
[58] Field of Search ................. 333/30 R, 72, 71; 310/313, 366; 331/107 A; 330/5.5

[56] References Cited

U.S. PATENT DOCUMENTS 4,023,124  5/1977  Parker et al. .................. 333/72

Primary Examiner—Alfred E. Smith
Assistant Examiner—Marvin Nussbaum
Attorney, Agent, or Firm—Hill, Van Santen, Steadman, Chiara & Simpson

[57] ABSTRACT

Transducer electrodes for filters or delay lines using surface waves wherein the transducers are formed by interdigital conducting films formed on the surface of piezoelectric substrates and wherein the length of the interdigital electrode fingers vary and wherein all of the fingers on at least one side are attached to an enlarged metal area which has a width equivalent to the total width of all of the electrode fingers on this side.

8 Claims, 1 Drawing Figure

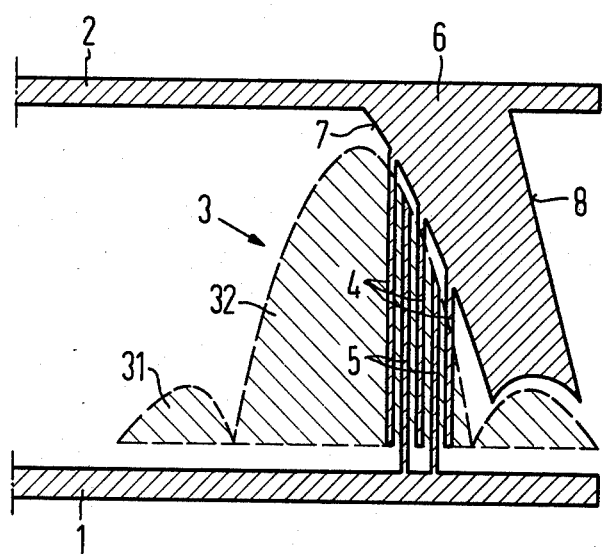

TRANSDUCER ELECTRODES FOR FILTER OR DELAY LINES UTILIZING SURFACE WAVES

BACKGROUND OF THE INVENTION

1. Field of the Invention

This invention relates in general to transducer electrodes for filters or delay lines utilizing surface wave phenomena on piezoelectric substrates wherein the transducers are formed by interdigital fingers with lengths which vary in a predetermined manner.

2. Description of the Prior Art

It is known that metalized surfaces on piezoelectric substrates reduce the propagation velocity of elastic surface waves. In the case of an interdigital transducer for elastic surface waves with longitudinally weighted electrode fingers, for example, this effect causes portions of the wave front in the electrode finger overlap zone to pass through a comparatively dense metalized zone while other portions of the wave front outside the finger overlap zone pass through regions wherein the metallization is relatively small. This causes the wave components which pass through the small metallized transducer zone to lead the wave components passing through the relatively dense metallized zones and causes undesired distortion of the wave front and, thus, discrepancies between the experimental frequency response and the desired frequency response of the transmission element.

So as to prevent this leading effect due to the portion of the wave passing through the smaller metallization zone, it has been known to provide so-called dummy fingers outside the finger electrode overlap zone. These dummy fingers can be insulated from the other electrode fingers or, alternatively, can be electrically connected with the adjacent electrode fingers.

These known dummy fingers have the same width as the other electrode fingers, in other words, about a quarter of the synchronous wave length of the surface wave. Consequently, such fingers have the disadvantage that the reflections of the surface waves at the edges of the fingers are added at the synchronous frequency impairing the amplitude and phase frequency response right in the middle of the transmission band. So as to eliminate these annoying reflections, it has been proposed to provide that the electrode fingers be formed as so-called split-fingers. For this construction, each of the electrode fingers is formed as a double finger but this results in undesired narrow metallized zones which are not only very delicate and difficult to produce but also have increased ohmic resistance and, thus, increase the loss of the electrical energy.

SUMMARY OF THE INVENTION

It is a primary object of the present invention to provide a transit time compensator for elastic surface waves in the peripheral zone of longitudinally weighted interdigital transducers which is easy to manufacture and causes no additional reflections at the finger edges and does not increase losses of electrical energy.

This object is achieved according to the present invention by providing electrode fingers outside the overlap zone which are connected together to form a closed metallized region which has a width that is equivalent to the overall width of all of the electrode fingers.

By connecting all of the electrode fingers and feeders outside the overlap zone together to form one closed metal area with an equivalent width in the direction of movement of the wave equal to the total of all of the electrode fingers provides the distinct improvement in the amplitude frequency response and the transient behaviour. It is particularly advantageous that the metal area have only two edges at which reflections can occur and has the advantage that over known devices a large number of reflecting edges are present which cause a correspondingly large number of reflections. The invention is also advantageous when compared with known solutions designed to compensate for component reflections by shaping the feeders and electrode fingers in a special manner as such compensation can only be realized precisely for a single frequency and as a result with broad band filters serious losses occur at the edges of the transmission band.

In the present invention, the metal area is advantageously connected to the grounded transducer electrode and forms part of the static shielding between the input and output transducers of the filter or the delay line.

According to another advantageous embodiment, the front and rear edges of the metal are smooth and at an oblique angle to the wave front. The reflections occurring at the edges are eliminated by this oblique arrangement.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWING

The FIGURE illustrates a partly diagrammatic plan view of an interdigital transducer according to the invention utilizing longitudinally weighted finger electrodes.

DESCRIPTION OF THE PREFERRED EMBODIMENTS

The FIGURE illustrates a partly diagrammatic view of an interdigital transducer according to the invention utilizing longitudinally weighted finger electrodes. A first transducer electrode 1 is formed of metallized material on a suitable piezoelectric substrate and has upwardly extending interdigital fingers 5 having different lengths as shown. A second metallized transducer electrode 2 is formed with an enlarged area 6 from one edge of which extend interdigitally mounted fingers 4 having different lengths and which are alternately spaced with the fingers 5 from the electrode 1.

The overlap zone 3 is illustrated by a lightly shaded area. The peripheral curvature of the overlap zone 3 corresponds to the function $y = \sin x/x$. The electrode fingers 4 are connected to the upper transducer electrode 2 and the electrode fingers 5 are connected electrically to the lower transducer electrode 1 as shown.

It can be observed from the drawing that when the surface wave moving to the right relative to the drawing generated in the area 31 of the overlap zone 3 must pass through all of the electrode fingers 4 and 5 whereas the surface wave generated in the upper portion of the area 32 of the overlap zone 3 which is also moving to the right will only pass through roughly one half of the metallized area which is that portion of the electrode fingers 4 connected to the upper electrode 2 and thus the portion which passes only through the upper portion of the fingers 4 will have a higher velocity than the wave which passes through all of the fingers in the lower area. However, in the present invention the difference in velocity occurring in the different zones of the surface wave front at the right of the peak of area 32 is compensated by the enlarged metallized area 6 according to the invention. The width of the metallized layer 6 which is the dimension between the edges 7 and 8 in the FIGURE is selected so that the total width measured in the direction of movement of the wave is equivalent to the sum of the "missing" and the "present" electrode fingers. A similar procedure of compensation of the different velocities of the wave portions moving to the right originating in the area 31 is performed at the depression of the overlap zone 3 between the sections 31 and 32. As a result of the missing portions of the fingers or feeder edges, no edge reflections will occur. Also, the metallized area 6 provides an extremely low ohmic feeder and eliminates the electrical losses that would otherwise occur in the electrode fingers. The metallized area 6 can be positioned with the transducer electrode 2 so that they can be connected to reference or ground potential and the area 6 will then form part of the static shielding system between the transmitting and receiving transducers.

The leading edge 7 relative to the incoming wave of the metallized area 6 as well as the rear edge 8 of the metallized area 6 are formed so that they are smooth with no abrupt steps and are formed so that they lie at an angle other than 0° to the wave front. The oblique arrangement eliminates reflections which would otherwise arise at the front and rear edges 7 and 8 of the metallized area 6. With the present invention the phase error will be less than 2°.

It is to be noted from the FIGURE that the edges 7 and 8 become closer together as they extend further away from the electrode 2 and this decrease in spacing is such that as the incoming wave portions encounter larger areas of fingers the width of the metallized area 6 or the distance between the surfaces 7 and 8 is decreased and portions of the wave adjacent the top electrode 2 which pass through smaller finger widths correspond to greater distances between the edges 7 and 8 of the metallized area 6.

Although the invention has been described with respect to preferred embodiments, it is not to be so limited, as changes and modifications may be made which are within the full intended scope as defined by the appended claims.

We claim as our invention:

1. Transducer electrodes for filters or delay lines utilizing the surface wave principle which extends in a longitudinal direction including a piezoelectric substrate with the transducers formed thereon as interdigital structures having longitudinally weighted electrode fingers which extend in the transverse direction, characterized in that the electrode fingers (4) outside the overlap zone (3) are joined together to form a closed tapered metal area (6) which extends in the transverse direction and has front and rear edges, which vary in distance apart at a particular point in the longitudinal direction as the total width in the longitudinal direction of all the electrode fingers (4, 5) at said point upon which a surface wave impinges.

2. Transducer electrodes as in claim 1, characterized in that the metal area (6) is connected to a grounded transducer electrode (2) and forms part of the static shielding between the input and output transducer of the filter or delay line.

3. Transducer electrodes as in claim 1 characterized in that the front (7) and rear edges (8) of the metal area (6) are smooth and lie at an angle other than zero degrees to the wave front.

4. A device comprising a substrate with a major surface,
   first and second substantially parallel metallized electrodes formed on said major surface of said substrate extending in a longitudinal direction,
   a first plurality of metallized fingers of different lengths extending from said first electrode in a direction normal to said first electrode,
   a generally tapered metallized conductive area extending from said second electrode with front and rear edges relative to a surface wave being at an angle other than zero degrees to said second electrode, and
   a second plurality of metallized fingers of different lengths extending from the front edge of said metallized conductive area normal to said second electrode and ones of said first and second plurality of fingers alternately spaced on said substrate.

5. A device according to claim 4 wherein the width in the longitudinal direction of each of said first and second plurality of fingers is the same.

6. A device according to claim 5 wherein the ends of said second plurality of fingers are spaced substantially the same distance from said first electrode.

7. A device according to claim 6 wherein the ends of said first plurality of fingers are spaced substantially the same distance from the front edge of said metallized conductive area.

8. A device according to claim 7 wherein there are surface waves which travel between said first and second electrodes and have amplitudes which vary in the direction between said electrodes as a function of distance parallel to said electordes and the lengths of said first and second plurality of fingers and the taper of said metallized conductive area is such that all components of said surface wave encounter equal total metallized regions in said first and second plurality of fingers and said metallized conductive area.

* * * * *